United States Patent
Suzumura et al.

(10) Patent No.: US 7,602,319 B2
(45) Date of Patent: Oct. 13, 2009

(54) IMAGE DECODING APPARATUS AND DECODING METHOD

(75) Inventors: Tatsuhiro Suzumura, Kawasaki (JP); Shuji Michinaka, Kawasaki (JP); Kiwamu Watanabe, Kawasaki (JP); Satoshi Takekawa, Kawasaki (JP); Masashi Jobashi, Kawasaki (JP); Hiromitsu Nakayama, Kawasaki (JP); Yoshinori Shigeta, Kawasaki (JP); Takaya Ogawa, Kawasaki (JP); Akihiro Oue, Palo Alto, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/041,395

(22) Filed: Mar. 3, 2008

(65) Prior Publication Data

US 2008/0238733 A1 Oct. 2, 2008

(30) Foreign Application Priority Data

Mar. 29, 2007 (JP) ............................. 2007-087822

(51) Int. Cl.
*H03M 7/40* (2006.01)
(52) U.S. Cl. .............................. 341/67; 341/50; 341/51
(58) Field of Classification Search .................. 341/50, 341/51, 67; 375/240.23; 382/246
See application file for complete search history.

(56) References Cited

U.S. PATENT DOCUMENTS

| 4,647,908 | A | * | 3/1987 | Ross et al. ..................... 341/67 |
| 5,883,589 | A | * | 3/1999 | Takishima et al. ............ 341/67 |
| 7,102,550 | B1 | * | 9/2006 | Watanabe et al. ............. 341/67 |
| 7,161,509 | B2 | | 1/2007 | Naito et al. |
| 2005/0147172 | A1 | * | 7/2005 | Winger et al. .......... 375/240.23 |
| 2005/0259742 | A1 | * | 11/2005 | Hellman ................ 375/240.23 |
| 2006/0109150 | A1 | * | 5/2006 | Naito .......................... 341/67 |
| 2006/0119490 | A1 | * | 6/2006 | Lim et al. ..................... 341/50 |

FOREIGN PATENT DOCUMENTS

JP 2006-157157 6/2006

* cited by examiner

*Primary Examiner*—Jean B Jeanglaude
(74) *Attorney, Agent, or Firm*—Oblon, Spivak, McClelland, Maier & Neustadt, L.L.P.

(57) ABSTRACT

An image decoding apparatus having: a table selection controller configured to output a syntax selection signal which selects one of a prefix, a suffix, and a syntax; a variable length code decoding device configured to receive a bit stream, the syntax selection signal, and a suffix length, and, by using data contained in the bit stream and the suffix length, simultaneously decode the prefix and the suffix and output the result if the syntax selection signal selects the prefix 1 and the suffix, and decode the syntax and output the result if the syntax selection signal selects the syntax; a level formation device configured to receive the decoded prefix, the decoded suffix, and the decoded syntax, and form and output a level; and a suffix length updating device configured to receive the decoded prefix, the decoded suffix, and the decoded syntax, and update the suffix length.

15 Claims, 10 Drawing Sheets suffixLength=0

| INPUT | OUTPUT | | |
|---|---|---|---|
| | lvp | lvs | CODE LENGTH |
| 1 | 0 | NONE | 1 |
| ⋮ | ⋮ | | |
| 0(×n) 1 | n | NONE | (n+1) |
| ⋮ | ⋮ | | |

FIG. 3 suffixLength=1

| INPUT | OUTPUT | | |
|---|---|---|---|
| | lvp | lvs | CODE LENGTH |
| 1 | 0 | NONE | 1 |
| ⋮ | ⋮ | | |
| 0(×13) 1 | 13 | NONE | 14 |
| 0(×14) 1 x | 14 | VALUE(1) | 15+1 |
| 0(×15) 1 1 | 15 | VALUE(1) | 16+1 |
| ⋮ | ⋮ | | |

FIG. 4 suffixLength=2

| INPUT | OUTPUT | | |
|---|---|---|---|
| | lvp | lvs | CODE LENGTH |
| 1 | 0 | NONE | 1 |
| ⋮ | ⋮ | | |
| 0(×13) 1 | 13 | NONE | 14 |
| 0(×14) 1 x x | 14 | VALUE(2) | 15+2 |
| 0(×15) 1 x x | 15 | VALUE(2) | 16+2 |
| ⋮ | ⋮ | | |

FIG. 5 suffixLength=3

| INPUT | OUTPUT | | |
|---|---|---|---|
| | lvp | lvs | CODE LENGTH |
| 1 | 0 | NONE | 1 |
| ⋮ | ⋮ | | |
| 0(×13) 1 | 13 | NONE | 14 |
| 0(×14) 1 x x x | 14 | VALUE (3) | 15+3 |
| 0(×15) 1 x x x | 15 | VALUE (3) | 16+3 |
| ⋮ | ⋮ | | |

FIG. 6 suffixLength=4

| INPUT | OUTPUT | | |
|---|---|---|---|
| | lvp | lvs | CODE LENGTH |
| 1 | 0 | NONE | 1 |
| ⋮ | ⋮ | | |
| 0(×13) 1 | 13 | NONE | 14 |
| 0(×14) 1 x x x x | 14 | VALUE (4) | 15+4 |
| 0(×15) 1 x x x x | 15 | VALUE (4) | 16+4 |
| ⋮ | ⋮ | | |

FIG. 7 suffixLength=5

| INPUT | OUTPUT | | |
|---|---|---|---|
| | lvp | lvs | CODE LENGTH |
| 1 | 0 | NONE | 1 |
| ⋮ | ⋮ | | |
| 0(×13) 1 | 13 | NONE | 14 |
| 0(×14) 1 x x x x x | 14 | VALUE (5) | 15+5 |
| 0(×15) 1 x x x x x | 15 | VALUE (5) | 16+5 |
| ⋮ | ⋮ | | |

FIG. 8 suffixLength=6

| INPUT | OUTPUT | | |
|---|---|---|---|
| | lvp | lvs | CODE LENGTH |
| 1 | 0 | NONE | 1 |
| ⋮ | ⋮ | | |
| 0(×13) 1 | 13 | NONE | 14 |
| 0(×14) 1 x x x x x x | 14 | VALUE (6) | 15+6 |
| 0(×15) 1 x x x x x x | 15 | VALUE (6) | 16+6 |
| ⋮ | ⋮ | | |

FIG. 9

IMAGE DECODING APPARATUS AND DECODING METHOD

CROSS REFERENCE TO RELATED APPLICATION

This application is based upon and claims benefit of priority under 35 USC §119 from the Japanese Patent Application No. 2007-87822, filed on Mar. 29, 2007, the entire contents of which are incorporated herein by reference.

BACKGROUND OF THE INVENTION

The present invention relates to an image decoding apparatus and decoding method and, more particularly, to an image decoding apparatus and decoding method suitable for decoding image data encoded by the H.264 format.

The international standardized encoding methods such as MPEG-4 are known as motion image encoding techniques, and ITU-Rec. H.264 Advanced Video Coding ISO/ITE International Standard 14496-10 (MPEG-4 AVC) abbreviated as H.264 is known as a new encoding method.

A variable-length code decoding device decodes a prefix level_prefix and suffix level_suffix by the following procedure. First, a table selection controller outputs a syntax selection signal so as to select a TrailingOnes syntax from the syntaxes level_prefix, level_suffix, and TrailingOnes. Accordingly, the variable-length code decoding device outputs the TrailingOnes syntax.

Then, the table selection controller outputs a syntax selection signal so as to select the prefix level_prefix syntax. The variable-length code decoding device outputs the prefix level_prefix by using a predetermined table.

A suffix level_suffix decoding determination device receives the decoded prefix level_prefix, and determines the presence/absence of the suffix level_suffix in accordance with the manual of H.264. The suffix level_suffix decoding determination device outputs the result to the table selection controller.

On the basis of this result, if the suffix level_suffix exists, the table selection controller outputs a syntax selection signal so as to select the suffix level_suffix. On the basis of a suffix length suffixLength output from a device for updating the suffix length suffixLength, the variable-length code decoding device decodes the suffix length suffixLength by using a predetermined table.

On the other hand, a level formation device calculates a level by using the syntaxes (TrailingOnes, prefix level_prefix, and suffix level_suffix) output from the variable-length code decoding device, and outputs the result to a suffix length (suffixLength) updating device.

The suffix length (suffixLength) updating device updates the suffix length suffixLength by using the value of the level output from the level formation device, and prepares for decoding the next suffix level_suffix.

When decoding the prefix level_prefix and suffix level_suffix by using the arrangement as described above, however, if the suffix level_suffix exists, the prefix level_prefix is first decoded, and then the suffix level_suffix is decoded by using the decoding result. That is, two cycles are required. This means that decoding of one residual data requires two cycles.

The residual data occupies most of the encoded image data. If the number of decoding cycles of this residual data increases, therefore, the operational frequency necessary for the required decoding performance of the system must be raised. This unavoidably increases the power consumption.

A reference disclosing the conventional image decoding technique is as follows.

Japanese Patent Laid-Open No. 2006-157157

SUMMARY OF THE INVENTION

According to one aspect of the invention, there is provided an image decoding apparatus comprising: a table selection controller configured to output a syntax selection signal which selects one of a prefix level_prefix, a suffix level_suffix, and a TrailingOnes syntax; a variable-length code decoding device configured to receive a bit stream, the syntax selection signal, and a suffix length suffixLength, and, by using data contained in the bit stream and the suffix length suffixLength, simultaneously decode the prefix level_prefix and the suffix level_suffix and output the result if the syntax selection signal selects the prefix level_prefix and the suffix level_suffix, and decode the TrailingOnes syntax and output the result if the syntax selection signal selects the TrailingOnes syntax; a level formation device configured to receive the decoded prefix level_prefix, the decoded suffix level_suffix, and the decoded TrailingOnes syntax, and form and output a level; and a suffix length updating device configured to receive the decoded prefix level_prefix, the decoded suffix level_suffix, and the decoded TrailingOnes syntax, and update the suffix length suffixLength.

According to one aspect of the invention, there is provided a method of performing an image decoding process by using an image decoding apparatus including a table selection controller, a variable-length code decoding device, a level formation device, and a suffix length updating device, the method comprising: outputting a syntax selection signal which selects one of a prefix level_prefix, a suffix level_suffix, and a TrailingOnes syntax, by using the table selection controller; receiving a bit stream, the syntax selection signal, and a suffix length suffixLength, and, by using data contained in the bit stream and the suffix length suffixLength, simultaneously decoding the prefix level_prefix and the suffix level_suffix and outputting the result if the syntax selection signal selects the prefix level_prefix and the suffix level_suffix, and decoding the TrailingOnes syntax and outputs the result if the syntax selection signal selects the TrailingOnes syntax, by using the variable-length code decoding device; receiving the decoded prefix level_prefix, the decoded suffix level_suffix, and the decoded TrailingOnes syntax, and forming and outputting a level, by using the level formation device; and receiving the decoded prefix level_prefix, the decoded suffix level_suffix, and the decoded TrailingOnes syntax, and updating the suffix length suffixLength, by using the suffix length updating device.

BRIEF DESCRIPTION OF THE DRAWINGS

FIGS. 3 to 9 are views for explaining examples of tables to be used in the variable-length code decoding device when a suffix length suffixLength is 0 to 6;

DETAILED DESCRIPTION OF THE INVENTION

An embodiment of the present invention will be explained below with reference to the accompanying drawings.

Figure 1:
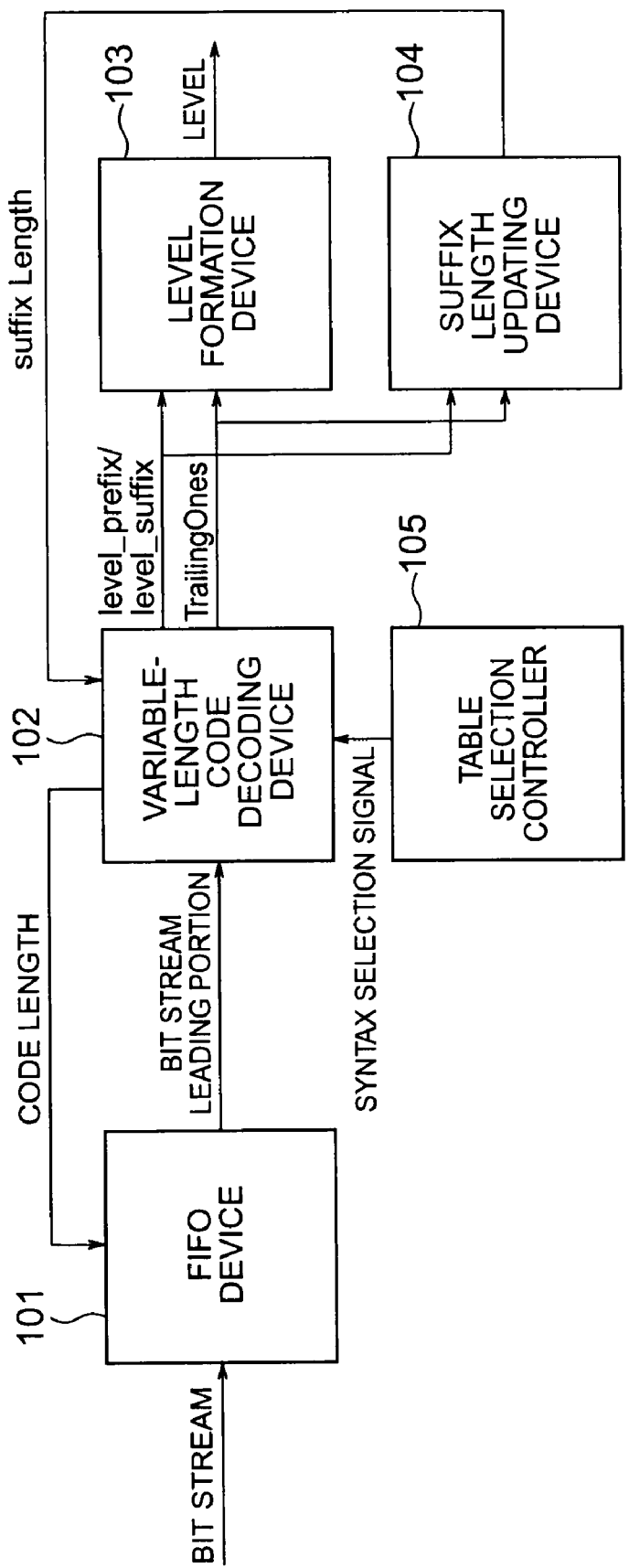
FIG. 1 is a block diagram showing the arrangement of an image decoding apparatus according to an embodiment of the present invention.

FIG. 1 shows the arrangement of an image decoding apparatus according to the embodiment of the present invention. This apparatus comprises a FIFO (First In First Out) device 101, variable-length code decoding device 102, level formation device 103, suffix length (suffixLength) updating device 104, and table selection controller 105. The operation of the apparatus will be described later.

Figure 2:
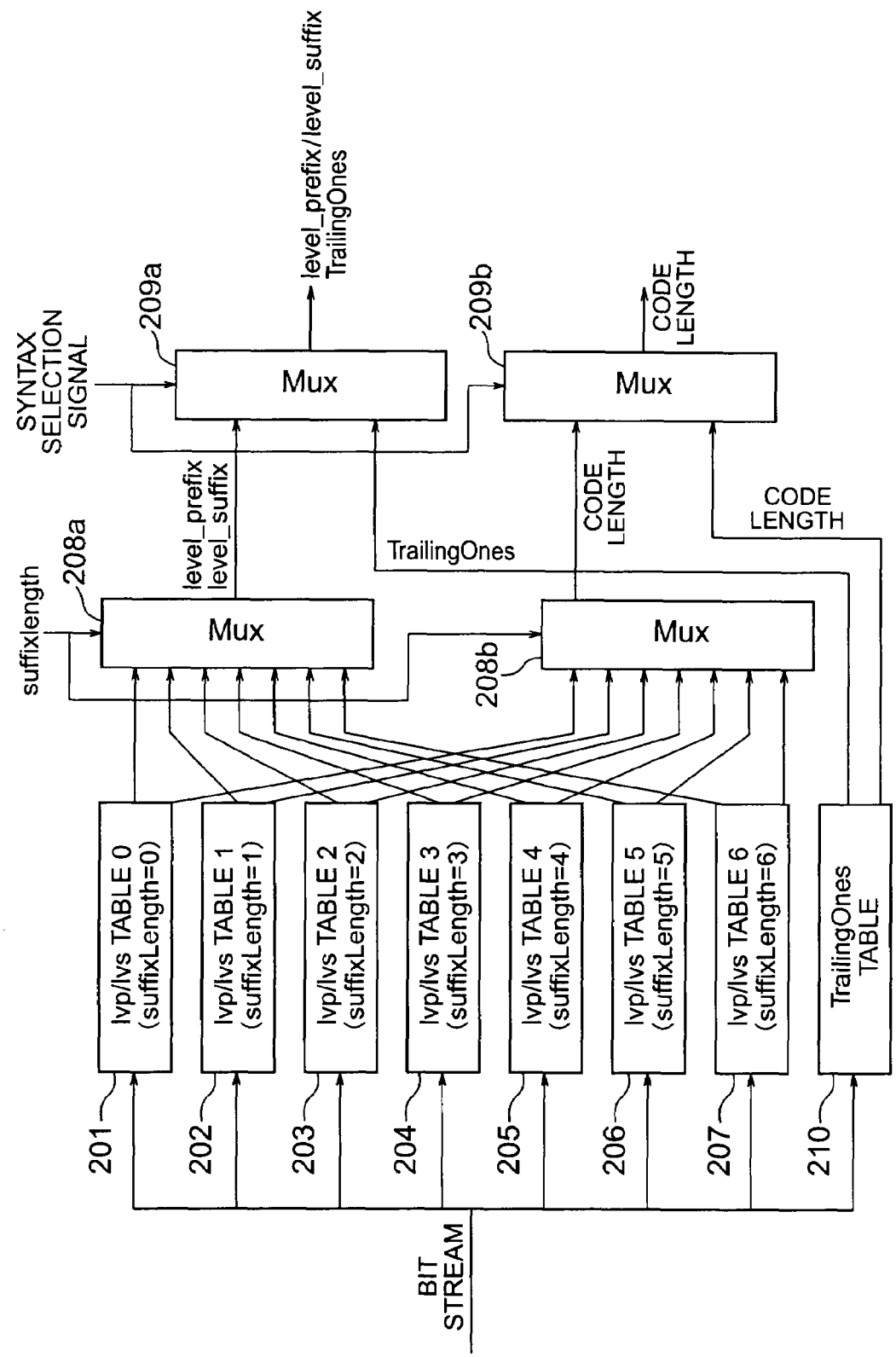
FIG. 2 is a circuit diagram showing the arrangement of a variable-length code decoding device in the image decoding apparatus.

As shown in, e.g., FIG. 2, the variable-length code decoding device 102 comprises prefix level_prefix/suffix level_suffix tables 201 to 207, a TrailingOnes table 210, and multiplexers 208a, 208b, 209a, and 209b.

A bit stream is supplied to the prefix level_prefix/suffix level_suffix tables 201 to 207 and TrailingOnes table 210. The tables 201 to 207 each supply the values of a prefix level_prefix and suffix level_suffix to the multiplexer 208a, and each supply the corresponding code length to the multiplexer 208b.

The suffix length (suffixLength) updating device 104 supplies an updated value of the suffix length suffixLength to the multiplexers 208a and 208b. The values of the prefix level_prefix and suffix level_suffix output from a corresponding one of the tables 201 to 207 are supplied to the multiplexer 209a, and the code length output from the corresponding one of the tables 201 to 207 is supplied to the multiplexer 209b.

In this case, a syntax selection signal is supplied to the multiplexers 209a and 209b so as to select the prefix level_prefix and suffix level_suffix. The values of the prefix level_prefix and suffix level_suffix are output to the level formation device 103, and the code length of the prefix level_prefix and suffix level_suffix is output to the FIFO device 101.

The prefix level_prefix/suffix level_suffix tables 201 to 207 respectively have arrangements as shown in FIGS. 3 to 9 in accordance with values "0" to "6" of the suffix length suffixLength.

For example, when the value of the suffix length suffixLength is "0", as shown in FIG. 3, values corresponding to a bit position when a value "1" initially exists in the leading portion of the bit stream are allocated to the prefix level_prefix and suffix level_suffix. In this example, if "1" exists in the first bit position of the bit stream, the value of the prefix level_prefix is "0", the value of the suffix level_suffix is "none", and the code length is "1". If "0" continues from the first to nth (n is an integer of 1 or more) bit positions and "1" exists in the (n+1)th bit position of the bit stream, the value of the prefix level_prefix is "n", the value of the suffix level_suffix is "none", and the code length is "n+1".

When the value of the suffix length suffixLength is "1", as shown in FIG. 4, if "1" exists in the first bit position of the bit stream, the value of the prefix level_prefix is "0", the value of the suffix level_suffix is "none", and the code length is "1". If "0" continues from the first to 13th bit positions and "1" exists in the 14th bit position of the bit stream, the value of the prefix level_prefix is "13", the value of the suffix level_suffix is "none", and the code length is "14". If "0" continues from the first to 14th bit positions and "1" exists in the 15th bit position of the bit stream (the 16th value can be either 0 or 1), the value of the prefix level_prefix is "14", the value of the suffix level_suffix is the same as that in the 15th bit position, and the code length is "16". This similarly applies to the cases where the values of the suffix length suffixLength are "2" to "5", so a repetitive explanation will be omitted.

When the value of the suffix length suffixLength is "6", for example, as shown in FIG. 9, if "0" continues from the first to 15th bit positions and "1" exists in the 16th bit position of the bit stream (the value in the 17th to 22nd bit positions can be either 0 or 1), the value of the prefix level_prefix is "15", the value of the suffix level_suffix is the same as that in the 17th to 22nd bit positions, and the code length is "22".

The suffix length (suffixLength) updating device 104 receives the prefix level_prefix, suffix level_suffix, and TrailingOnes syntax, and updates the suffix length suffixLength. More specifically, the suffix length (suffixLength) updating device 104 maintains the current suffix length suffixLength or increments it by "1".

The procedure of the suffix length (suffixLength) updating device 104 will be explained below with reference to a flowchart shown in FIG. 10.

In step S10, the suffix length (suffixLength) updating device 104 checks whether the suffix length suffixLength is less than 6. If the result is true (Yes), the process advances to step S11. If the result is false (No), the suffix length (suffixLength) updating device 104 maintains the current suffix length suffixLength and outputs it as an updated value.

In step S11, the suffix length (suffixLength) updating device 104 checks whether the prefix level_prefix is less than 8. If the result is true, the process advances to step S12. If the result is false, the suffix length (suffixLength) updating device 104 increments the current suffix length suffixLength by "1", and outputs the incremented value as an updated value.

In step S12, the suffix length (suffixLength) updating device 104 checks whether the TrailingOnes syntax is input immediately after decoding and less than 3. The process advances to step S13 if the result is true, and to step S16 if the result is false.

In step S13, the suffix length (suffixLength) updating device 104 checks whether the suffix length suffixLength is 0. The process advances to step S14 if the result is true, and to step S15 if the result is false.

Also, in step S16, the suffix length (suffixLength) updating device 104 checks whether the suffix length suffixLength is 0. The process advances to step S17 if the result is true, and advances to step S18 if the result is false.

In step S14, the suffix length (suffixLength) updating device 104 checks whether the prefix level_prefix is larger than 3. If the result is true, the suffix length (suffixLength) updating device 104 increments the current suffix length suffixLength by "1", and outputs the incremented value. If the result is false, the suffix length (suffixLength) updating device 104 maintains and outputs the current suffix length suffixLength.

In step S15, the suffix length (suffixLength) updating device 104 checks whether the prefix level_prefix is larger than 1. If the result is true, the suffix length (suffixLength) updating device 104 increments the current suffix length suffixLength by "1", and outputs the incremented value. If the result is false, the suffix length (suffixLength) updating device 104 maintains and outputs the current suffix length suffixLength.

In step S17, the suffix length (suffixLength) updating device 104 checks whether the prefix level_prefix is larger than 5. If the result is true, the suffix length (suffixLength) updating device 104 increments the current suffix length suffixLength by "1", and outputs the incremented value. If the result is false, the suffix length (suffixLength) updating device 104 maintains and outputs the current suffix length suffixLength.

In step S18, the suffix length (suffixLength) updating device 104 checks whether the prefix level_prefix is larger than 3. If the result is true, the suffix length (suffixLength) updating device 104 increments the current suffix length suffixLength by "1", and outputs the incremented value. If the result is false, the suffix length (suffixLength) updating device 104 maintains and outputs the current suffix length suffixLength.

Figure 11:
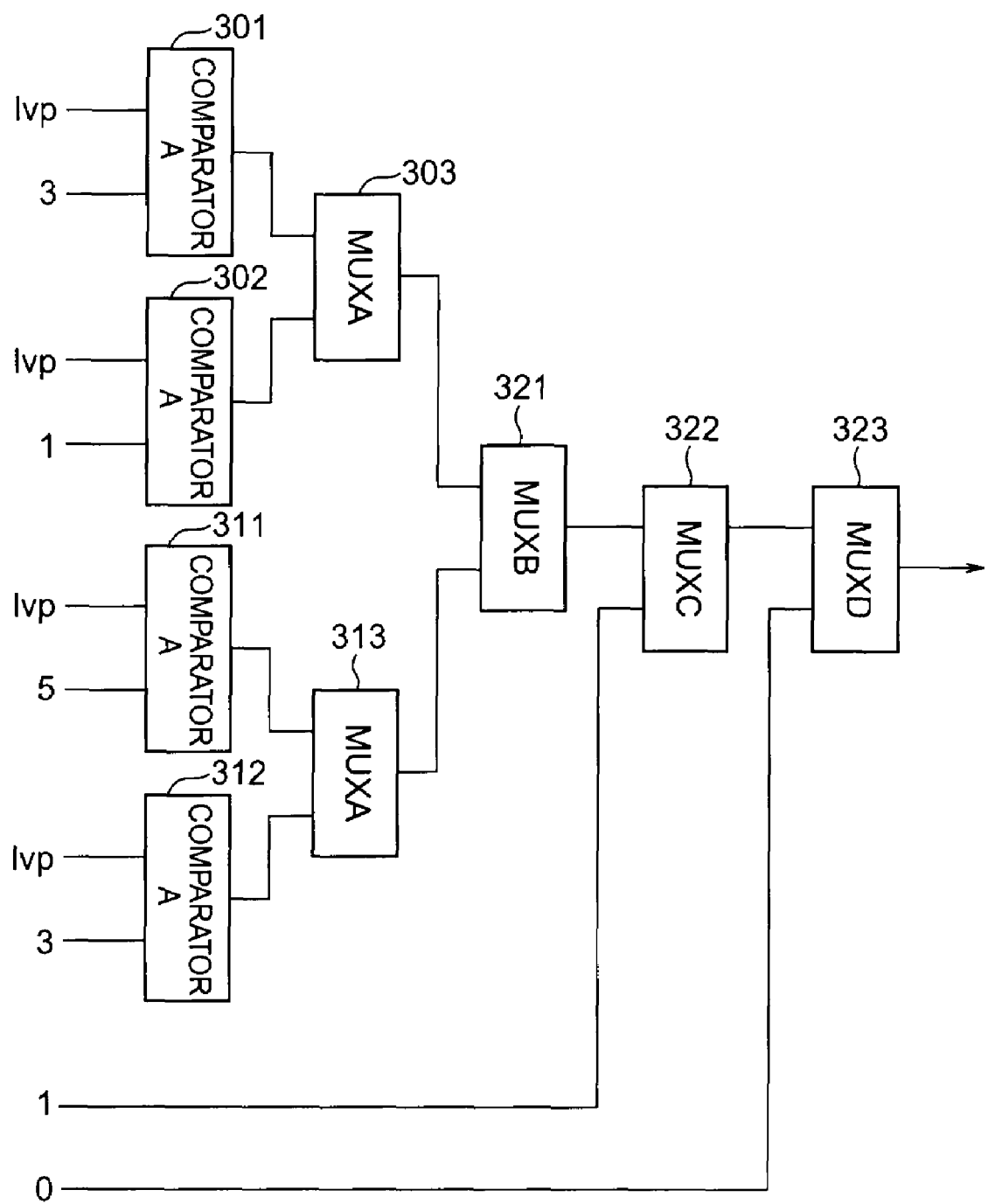
FIG. 11 is a circuit diagram showing an example of the arrangement of the suffix length (suffixLength) updating device.

FIG. 11 shows an example of a practical circuit configuration of the suffix length (suffixLength) updating device 104 that performs the processing as described above. The device 104 comprises comparators A 301, 302, 311, and 312, multiplexers A 303 and 313, a multiplexer B 321, a multiplexer C 322, and a multiplexer D 323.

Figure 12:
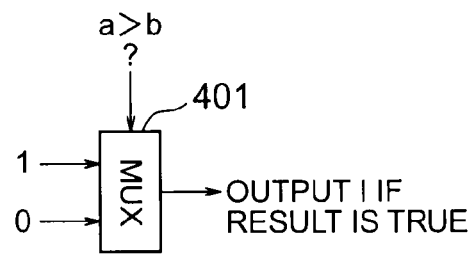
FIG. 12 is a circuit diagram showing an example of the arrangement of a comparator A in the suffix length (suffixLength) updating device.

The comparators A 301, 302, 311, and 312 each have, e.g., the same arrangement as that of a multiplexer 401 shown in FIG. 12. Each comparator compares the prefix level_prefix with a predetermined input value (e.g., "3" for the comparator A 301). Also, each comparator receives values "1" and "0", and outputs "1" if the result is true, and "0" if the result is false.

Figure 13:
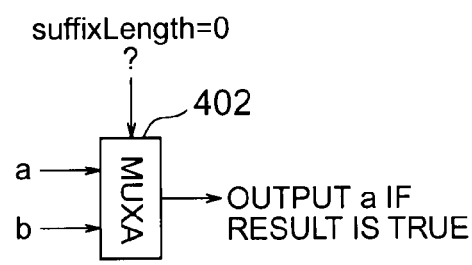
FIGS. 13 to 16 are circuit diagrams showing examples of the arrangements of multiplexers A to D in the suffix length (suffixLength) updating device.

The multiplexers A 303 and 313 each have, e.g., the same arrangement as that of a multiplexer 402 shown in FIG. 13. Each multiplexer receives values "a" and "b" from the input stage, and checks whether the suffix length suffixLength is 0. The multiplexer outputs "a" if the result is true, and "b" if the result is false.

Figure 14:
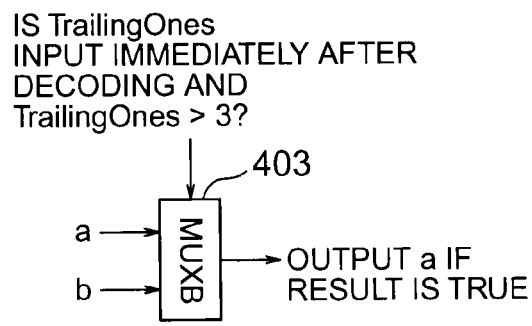

The multiplexer B 321 has the same arrangement as that of a multiplexer 403 shown in FIG. 14. The multiplexer B 321 receives values "a" and "b" from the input stage, and checks whether the TrailingOnes syntax is input immediately after decoding and larger than 3. The multiplexer B 321 outputs "a" if the result is true, and "b" if the result is false.

Figure 15:
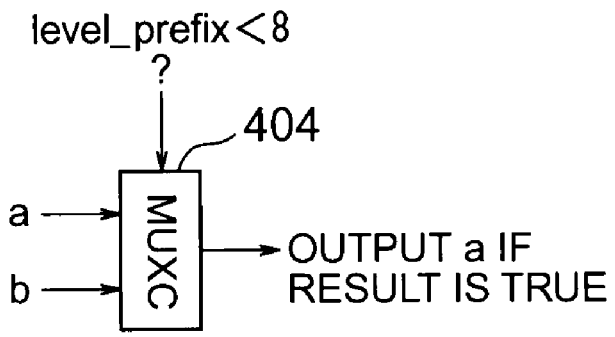

The multiplexer C 322 has, e.g., the same arrangement as that of a multiplexer 404 shown in FIG. 15. The multiplexer C 322 receives values "a" and "b" from the input stage, and checks whether the prefix level_prefix is less than 8. The multiplexer C 322 outputs "a" if the result is true, and "b" if the result is false.

Figure 16:
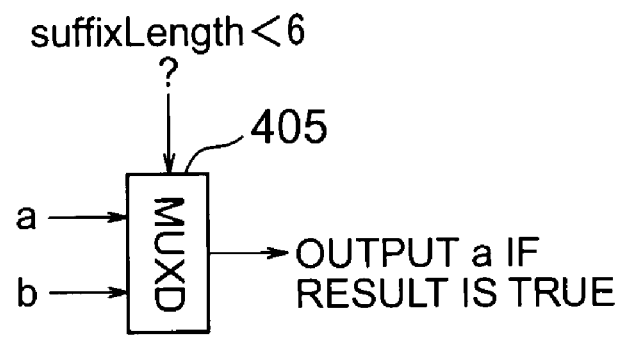

The multiplexer D 323 has, e.g., the same arrangement as that of a multiplexer 405 shown in FIG. 16. The multiplexer D 323 receives values "a" and "b" from the input stage, and checks whether the suffix length suffixLength is less than 6. The multiplexer D 323 outputs "a" if the result is true, and "b" if the result is false.

The operation of the suffix length (suffixLength) updating device 104 having the above arrangement will be explained below with reference to FIG. 11. Note that the order of processes is partially different from that of the procedure shown in the flowchart of FIG. 10 because the operational speed can be increased by performing the parallel processing of the comparators A 301, 302, 311, and 312 and the multiplexers 303 and 313 as earlier as possible, but the obtained result remains the same. Note also that the practical circuit configurations shown in FIGS. 11 and 12 to 16 are merely examples and can be variously modified when implementing the flowchart shown in FIG. 10.

The comparator A 301 checks whether the prefix level_prefix is larger than 3, and outputs "1" if the result is true, and "0" if the result is false. Similarly, the comparator A 302 checks whether the prefix level_prefix is larger than 1, the comparator A 311 checks whether the prefix level_prefix is larger than 5, and the comparator A 312 checks whether the prefix level_prefix is larger than 3. Each comparator A outputs "1" if the result is true, and "0" if the result is false.

If the suffix length suffixLength is 0 in the multiplexer A 303, the multiplexer A 303 selectively outputs the output value from the comparator A 301 from the values output from the comparators A 301 and 302. If the suffix length suffixLength is not 0, the multiplexer A 303 selectively outputs the output value from the comparator A 302.

Likewise, if the suffix length suffixLength is 0 in the multiplexer A 313, the multiplexer A 313 selectively outputs the output value from the comparator A 311 from the values output from the comparators A 311 and 312. If the suffix length suffixLength is not 0, the multiplexer A 313 selectively outputs the output value from the comparator A 312.

The multiplexer B 321 checks whether the TrailingOnes syntax is input immediately after decoding and larger than 3. The multiplexer B 321 selectively outputs the output value from the multiplexer A 303 if the result is true, and the output value from the multiplexer A 313 if the result is false.

The multiplexer C 322 checks whether the prefix level_prefix is less than 8. The multiplexer C 322 selectively outputs the output value from the multiplexer B 321 if the result is true, and "1" if the result is false.

The multiplexer D 323 checks whether the prefix level_prefix is less than 6. The multiplexer D 323 selectively outputs the output value from the multiplexer C 322 if the result is true, and "0" if the result is false.

The operation of the image processing apparatus according to this embodiment having the above arrangement will be explained below with reference to FIG. 1.

The table selection controller 105 outputs a syntax selection signal so as to select the TrailingOnes syntax among other syntaxes. The FIFO device 101 receives an externally input bit stream, and outputs the bit stream in the input order by using the code length supplied from the variable-length code decoding device 102 as an output unit.

As shown in FIG. 2, the variable-length code decoding device 102 decodes the TrailingOnes syntax by using the TrailingOnes table 210, outputs the TrailingOnes syntax via the multiplexer 209a, and outputs the code length of the TrailingOnes syntax via the multiplexer 209b. The TrailingOnes syntax is supplied to the level formation device 103 and suffix length (suffixLength) updating device 104. The code length is output to the FIFO device 101.

The table selection controller 105 outputs a syntax selection signal so as to select the prefix level_prefix and suffix level_suffix syntaxes.

The variable-length code decoding device 102 receives the leading portion of the bit stream output from the FIFO device 101, the updated suffix length suffixLength from the suffix length (suffixLength) updating device 104, and the syntax selection signal from the table selection controller 105. As shown in FIG. 2, on the basis of a bit position where a value "1" exists for the first time in the leading portion of the bit stream, the variable-length code decoding device 102 simultaneously decodes the prefix level_prefix, the suffix level_suffix, and their code length by using the prefix level_prefix/suffix level_suffix tables 201 to 207.

In accordance with the value of the suffix length suffixLength, the variable-length code decoding device 102 selectively outputs the corresponding prefix level_prefix/suffix level_suffix by using the multiplexer 208a. Also, in accordance with the value of the suffix length suffixLength, the variable-length code decoding device 102 selectively outputs the corresponding code length by using the multiplexer 208b.

The variable-length code decoding device 102 outputs the prefix level_prefix and suffix level_suffix via the multiplexer 209a, and outputs their code length via the multiplexer 209b.

In this manner, the variable-length code decoding device 102 outputs the TrailingOnes syntax, prefix level_prefix, and suffix level_suffix to the level formation device 103 and suffix length (suffixLength) updating device 104, and the code length to the FIFO device 101.

The FIFO device 101 updates the bit stream by using the input code length.

The level formation device 103 forms a level by using the input prefix level_prefix, suffix level_suffix, and TrailingOnes syntaxes, and outputs the level.

Figure 10:
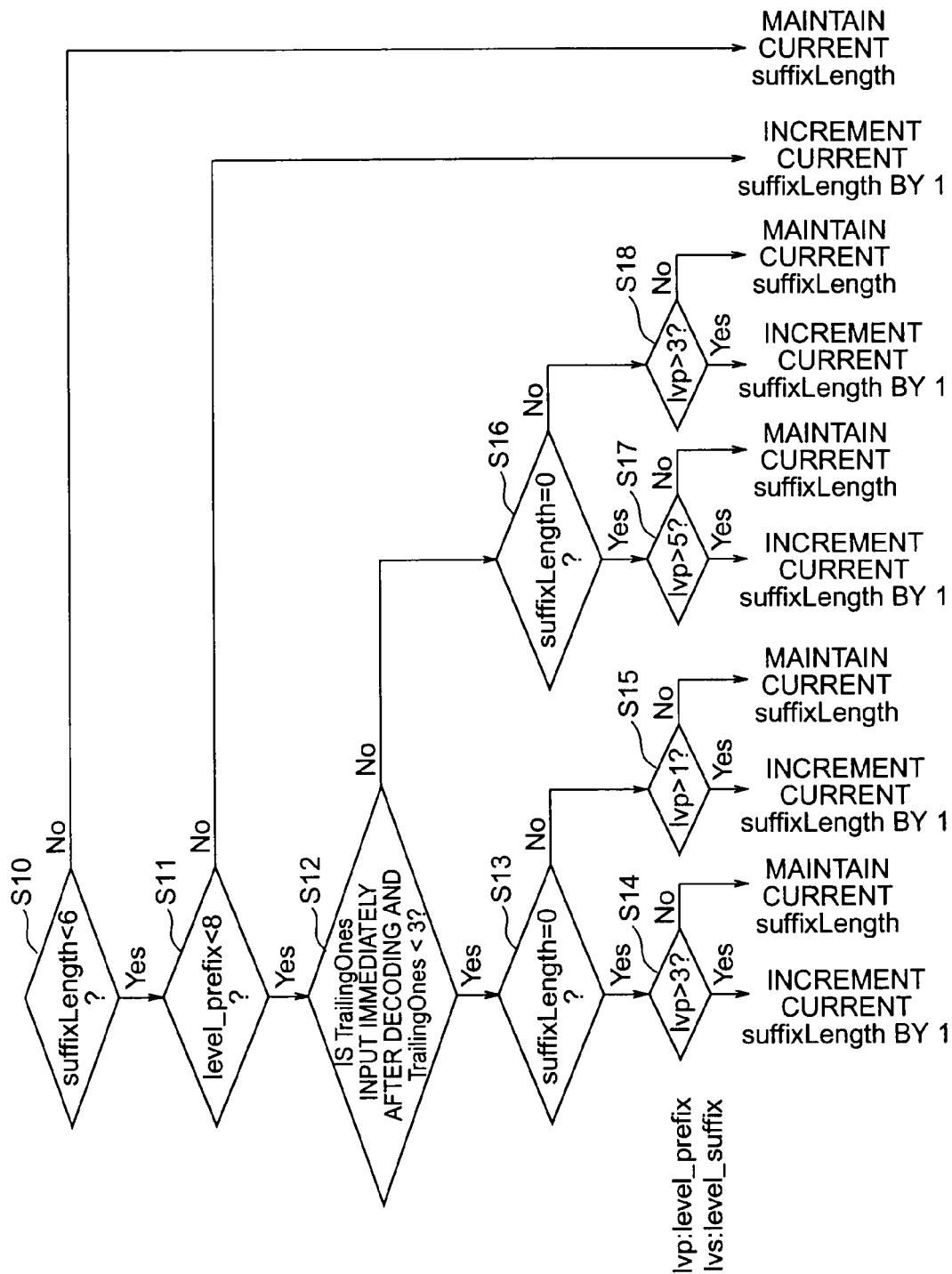
FIG. 10 is a flowchart showing the procedure of processing performed by a suffix length (suffixLength) updating device in the image decoding apparatus.

The suffix length (suffixLength) updating device 104 updates the suffix length suffixLength, in accordance with the flowchart shown in FIG. 10 or by using the circuit configuration shown in FIG. 11, by using the input prefix level_prefix, suffix level_suffix, and TrailingOnes syntax. The suffix length (suffixLength) updating device 104 outputs the updated suffix length suffixLength to the variable-length code decoding device 102.

As described above, this embodiment can simultaneously decode the prefix level_prefix and suffix level_suffix in one cycle.

Consequently, the number of cycles required for the syntax decoding process decreases. Even when decoding a high-resolution (HD) image or the like, therefore, the operational frequency can be set lower than that in the conventional apparatus. This makes it possible to reduce the power consumption.

Figure 17:
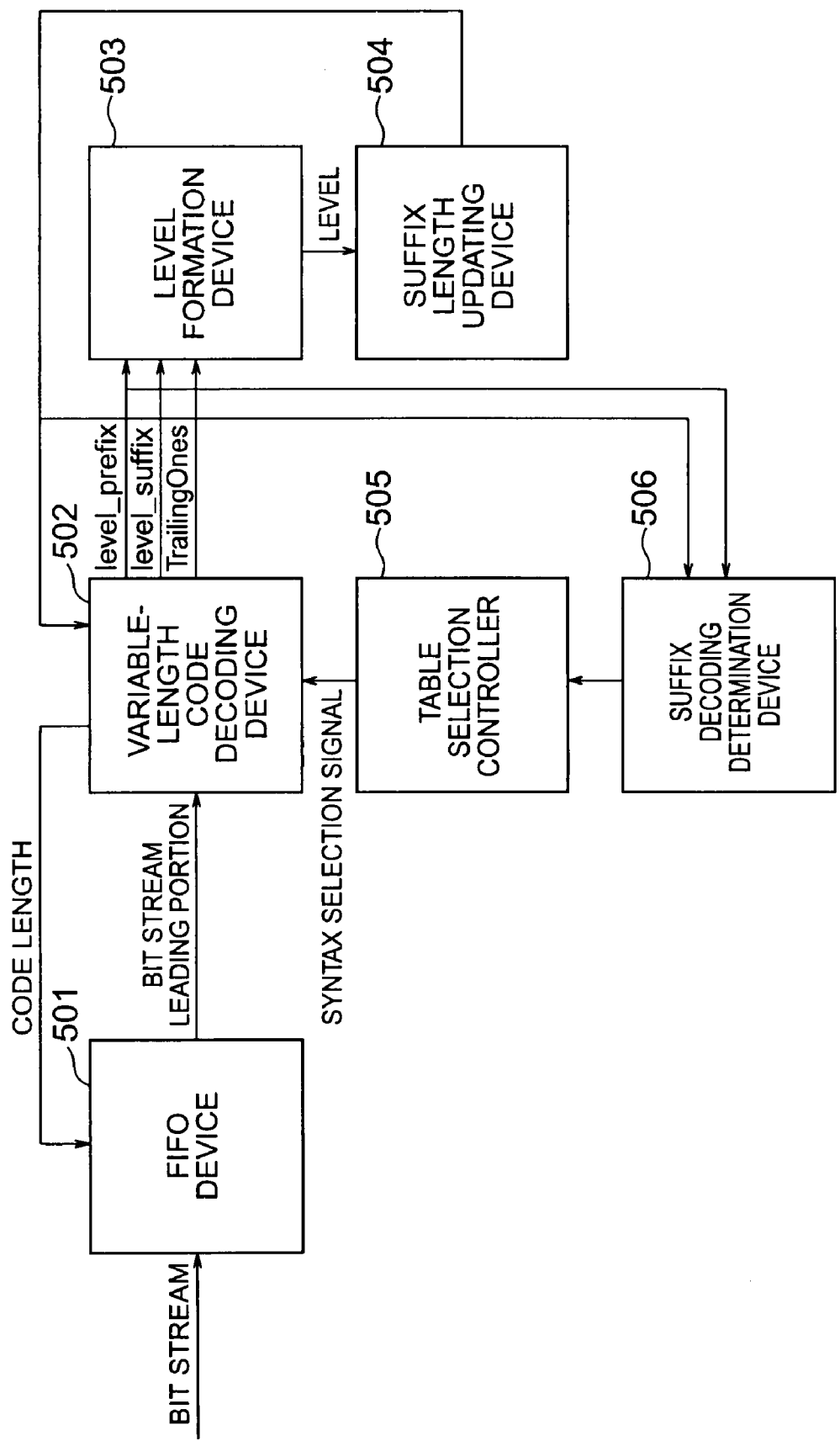
FIG. 17 is a block diagram showing the arrangement of an image decoding apparatus according to a comparative example.

FIG. 17 shows the arrangement of an image decoding apparatus according to a comparative example.

A table selection controller 505 outputs a syntax selection signal to a variable-length code decoding device 502 so as to select a TrailingOnes syntax from a prefix level_prefix, a suffix level_suffix, and the TrailingOnes syntax. Accordingly, the variable-length code decoding device 502 outputs the TrailingOnes syntax.

The table selection controller 505 outputs a syntax selection signal so as to select the prefix level_prefix. The variable-length code decoding device 502 outputs the prefix level_prefix by using a predetermined table.

When receiving the decoded prefix level_prefix, a suffix (level_suffix) decoding determination device 506 determines the presence/absence of the suffix level_suffix in accordance with the manual of H.264, and outputs the result to the table selection controller 505.

If the result indicates that the suffix level_suffix exists, the table selection controller 505 outputs a syntax selection signal so as to select the suffix level_suffix. On the basis of a suffix length suffixLength output from a suffix length (suffixLength) updating device 504, the variable-length code decoding device 502 decodes the suffix length suffixLength by using a predetermined table.

On the other hand, a level formation device 503 calculates a level by using the syntaxes (TrailingOnes, prefix level_prefix, and suffix level_suffix) output from the variable-length code decoding device 502, and outputs the result to the suffix length (suffixLength) updating device 504.

The suffix length (suffixLength) updating device 504 updates the suffix length suffixLength by using the value of the level output from the level formation device 503, and outputs the result to the variable-length code decoding device 502.

When decoding the prefix level_prefix and suffix level_suffix in the image decoding apparatus according to the comparative example as described above, if the suffix level_suffix exists, it is necessary to first decode the prefix level_prefix and then decode the suffix level_suffix by using the decoding result, so two cycles are necessary. That is, decoding of one residual data requires two cycles. This increases the number of cycles required for the decoding process, thereby increasing the operational frequency and hence the power consumption.

By contrast, the above embodiment can simultaneously decode the prefix level_prefix and suffix level_suffix in one cycle. Consequently, the power consumption can be reduced because the operational frequency can be set lower than that in the comparative example.

As described above, the image decoding apparatus and decoding method of the above embodiment can decode the residual data (the prefix level_prefix and suffix level_suffix) at high speed and reduce the power consumption.

The above embodiment is merely an example and hence does not limit the present invention. Accordingly, the present invention can be variously modified within the technical scope of the invention.

What is claimed is:

1. An image decoding apparatus comprising:
    a table selection controller configured to output a syntax selection signal which selects one of a prefix, a suffix, and a syntax;
    a variable length code decoding device configured to receive a bit stream, the syntax selection signal, and a suffix length, and, by using data contained in the bit stream and the suffix length, simultaneously decode the prefix and the suffix and output the result if the syntax selection signal selects the prefix and the suffix, and decode the syntax and output the result if the syntax selection signal selects the syntax;
    a level formation device configured to receive the decoded prefix, the decoded suffix, and the decoded syntax, and form and output a level; and
    a suffix length updating device configured to receive the decoded prefix, the decoded suffix, and the decoded syntax, and update the suffix length.

2. The apparatus according to claim 1, wherein
    if the syntax selection signal selects the prefix and the suffix, said variable length code decoding device decodes a code length of the prefix and the suffix, and outputs the decoded code length, and
    the image decoding apparatus further comprises a FIFO device configured to receive a bit stream, receive the code length of the prefix and the suffix from said variable length code decoding device, and output the bit stream using the code length as an output unit to said variable length code decoding device.

3. The apparatus according to claim 2, wherein said variable length code decoding device simultaneously decodes the prefix and the suffix by using a prefix/suffix table formed for each value of suffix length, and showing relationships between a bit position where a predetermined value exists from a leading portion of the bit stream, the prefix, and the suffix.

4. The apparatus according to claim 2, wherein said variable length code decoding device simultaneously decodes the prefix, the suffix, and the code length of the prefix and the suffix by using a prefix/suffix table formed for each value of the suffix length, and showing relationships between a bit position where a predetermined value exists from a leading portion of the bit stream, the prefix, the suffix, and the code length of the prefix and the suffix.

5. The apparatus according to claim 1, wherein said variable length code decoding device simultaneously decodes the prefix and the suffix by using a prefix/suffix table formed for each value of the suffix length, and showing relationships between a bit position where a predetermined value exists from a leading portion of the bit stream, the prefix, and the suffix.

6. The apparatus according to claim 1, wherein said variable length code decoding device simultaneously decodes the prefix, the suffix, and the code length of the prefix and the suffix by using a prefix/suffix table formed for each value of the suffix length, and showing relationships between a bit position where a predetermined value exists from a leading portion of the bit stream, the prefix, the suffix, and the code length of the prefix and the suffix.

7. The apparatus according to claim 1, wherein
said variable length code decoding device comprises:
a prefix/suffix table configured to receive the bit stream, and simultaneously output the prefix and the suffix corresponding to a bit position where a predetermined value exists from a leading portion of the bit stream;
a syntax table configured to receive the bit stream, and output the syntax corresponding to a bit position where a predetermined value exists from a leading portion of the bit stream;
a first multiplexer configured to receive the suffix length, and selectively output one of the prefix, the suffix, and the syntax, which corresponds to a value of the suffix length, the prefix and the suffix being output from the prefix/suffix table, and the syntax being output from the syntax table; and a second multiplexer configured to receive the syntax selection signal and the output from the first multiplexer, and selectively output the syntax selected by the syntax selection signal from the output from the first multiplexer.

8. The apparatus according to claim 1, wherein said suffix length updating device maintains a value of the decoded suffix length and outputs the value as an updated suffix length, if the decoded suffix length is not less than 6,
increments the suffix length by 1 and outputs the incremented suffix length as an updated suffix length, if the decoded suffix length is less than 6 and the decoded prefix is not less than 8,
increments the suffix length by 1 and outputs the incremented suffix length as an updated suffix length, if the decoded suffix length is less than 6, the decoded prefix is less than 8, the decoded syntax is input immediately after decoding and less than 3, the suffix length is 0, and the prefix is larger than 3,
maintains a value of the suffix length and outputs the value as an updated suffix length, if the decoded suffix length is less than 6, the decoded prefix is less than 8, the decoded syntax is input immediately after decoding and less than 3, the suffix length is 0, and the prefix is not more than 3,
increments the suffix length by 1 and outputs the incremented suffix length as an updated suffix length, if the decoded suffix length is less than 6, the decoded prefix is less than 8, the decoded syntax is input immediately after decoding and less than 3, the suffix length is not 0, and the prefix is larger than 1,
maintains a value of the and outputs the value as an updated suffix length, if the decoded suffix length is less than 6, the decoded prefix is less than 8, the decoded syntax is input immediately after decoding and less than 3, the suffix length is not 0, and the prefix is not more than 1,
increments the suffix length by 1 and outputs the incremented suffix length as an updated suffix length, if the decoded suffix length is less than 6, the decoded prefix is less than 8, the decoded syntax is input immediately after decoding and less than 3, the suffix length is 0, and the prefix is larger than 5,
maintains a value of the suffix length and outputs the value as an updated suffix length, if the decoded suffix length is less than 6, the decoded prefix is less than 8, the decoded syntax is input immediately after decoding and less than 3, the suffix length is 0, and the prefix is not more than 5,
increments the suffix length by 1 and outputs the incremented suffix length as an updated suffix length, if the decoded suffix length is less than 6, the decoded prefix is less than 8, the decoded syntax is input immediately after decoding and less than 3, the suffix length is not 0, and the prefix is larger than 3, and
maintains a value of the suffix length and outputs the value as an updated suffix length, if the decoded suffix length is less than 6, the decoded prefix is less than 8, the decoded syntax is input immediately after decoding and less than 3, the suffix length is not 0, and the prefix is not more than 3.

9. The apparatus according to claim 1, wherein said suffix length updating device comprises:
a first comparator configured to receive the prefix, output 1 if the prefix is larger than 3, and output 0 if the prefix is not more than 3;
a second comparator configured to receive the prefix, output 1 if the prefix is larger than 1, and output 0 if the prefix is not more than 1;
a first multiplexer configured to receive the output from said first comparator, the output from said second comparator, and the suffix length, selectively output the output from said first comparator if the suffix length is 0, and selectively output the output from said second comparator if the suffix length is not 0;
a third comparator configured to receive the prefix, output 1 if the prefix is larger than 5, and output 0 if the prefix is not more than 5;
a fourth comparator configured to receive the prefix, output 1 if the prefix is larger than 3, and output 0 if the prefix is not more than 3;
a second multiplexer configured to receive the output from said third comparator, the output from said fourth comparator, and the suffix length, selectively output the output from said third comparator if the suffix length is 0, and selectively output the output from said fourth comparator if the suffix length is not 0;
a third multiplexer configured to receive the output from said first multiplexer, the output from said second multiplexer, and the syntax, selectively output the output from said first multiplexer if the syntax is input immediately after decoding and larger than 3, and selectively output the output from said second multiplexer if the syntax is input immediately after decoding and not more than 3;
a fourth multiplexer configured to receive the output from said third multiplexer and the prefix, selectively output the output from said third multiplexer if the prefix is smaller than 8, and output 1 if the prefix is not less than 8; and
a fifth multiplexer configured to receive the output from said fourth multiplexer and the prefix, selectively output the output from said fourth multiplexer if the prefix is smaller than 6, and output 0 if the prefix is not less than 6.

10. A method of performing an image decoding process by using an image decoding apparatus including a table selection controller, a variable length code decoding device, a level formation device, and a suffix length updating device, the method comprising:
   outputting a syntax selection signal which selects one of a prefix, a suffix, and a syntax, by using the table selection controller;
   receiving a bit stream, the syntax selection signal, and a suffix length, and, by using data contained in the bit stream and the suffix length, simultaneously decoding the prefix and the suffix and outputting the result if the syntax selection signal selects the prefix and the suffix, and decoding the syntax and outputting the result if the syntax selection signal selects the syntax, by using the variable length code decoding device;
   receiving the decoded prefix, the decoded suffix, and the decoded syntax, and forming and outputting a level, by using the level formation device; and
   receiving the decoded prefix, the decoded suffix, and the decoded syntax, and updating the suffix length, by using the suffix length updating device.

11. The method according to claim 10, further comprising:
   when simultaneously decoding the prefix and the suffix and outputting the result, simultaneously decoding and outputting a code length of the prefix and the suffix; and
   receiving a bit stream, receiving the code length of the prefix and the suffix from the variable length code decoding device, and outputting the bit stream using the code length as an output unit to the variable length code decoding device.

12. The method according to claim 11, wherein when simultaneously decoding the prefix and the suffix and outputting the result, the prefix and the suffix are simultaneously decoded by using a prefix/suffix table formed for each value of the suffix length, and showing relationships between a bit position where a predetermined value exists from a leading portion of the bit stream, the prefix, and the suffix.

13. The method according to claim 11, wherein when simultaneously decoding the prefix and the suffix and outputting the result, the prefix, the suffix, and the code length of the prefix and the suffix are simultaneously decoded by using a prefix/suffix table formed for each value of the suffix length, and showing relationships between a bit position where a predetermined value exists from a leading portion of the bit stream, the prefix, the suffix, and the code length of the prefix and the suffix.

14. The method according to claim 10, wherein when simultaneously decoding the prefix and the suffix and outputting the result, the prefix and the suffix are simultaneously decoded by using a prefix/suffix table formed for each value of the suffix length, and showing relationships between a bit position where a predetermined value exists from a leading portion of the bit stream, the prefix, and the suffix.

15. The method according to claim 10, wherein when updating the suffix length
   a value of the decoded suffix length is maintained and output as an updated suffix length, if the decoded suffix length is not less than 6,
   the suffix length is incremented by 1 and the incremented suffix length is output as an updated suffix length, if the decoded suffix length is less than 6 and the decoded prefix is not less than 8,
   the suffix length is incremented by 1 and the incremented suffix length is output as an updated suffix length, if the decoded suffix length is less than 6, the decoded prefix is less than 8, the decoded syntax is input immediately after decoding and less than 3, the suffix length is 0, and the prefix is larger than 3,
   a value of the suffix length is maintained and output as an updated suffix length, if the decoded suffix length is less than 6, the decoded prefix is less than 8, the decoded syntax is input immediately after decoding and less than 3, the suffix length is 0, and the prefix is not more than 3,
   the suffix length is incremented by 1 and the incremented suffix length is output as an updated suffix length, if the decoded suffix length is less than 6, the decoded prefix is less than 8, the decoded syntax is input immediately after decoding and less than 3, the suffix length is not 0, and the prefix is larger than 1,
   a value of the suffix length is maintained and output as an updated suffix length, if the decoded suffix length is less than 6, the decoded prefix is less than 8, the decoded syntax is input immediately after decoding and less than 3, the suffix length is not 0, and the prefix is not more than 1,
   the suffix length is incremented by 1 and the incremented suffix length is output as an updated suffix length, if the decoded suffix length is less than 6, the decoded prefix is less than 8, the decoded syntax is input immediately after decoding and less than 3, the suffix length is 0, and the prefix is larger than 5,
   a value of the suffix length is maintained and output as an updated suffix length, if the decoded suffix length is less than 6, the decoded prefix is less than 8, the decoded syntax is input immediately after decoding and less than 3, the suffix length is 0, and the prefix is not more than 5,
   the suffix length is incremented by 1 and the incremented suffix length is output as an updated suffix length, if the decoded suffix length is less than 6, the decoded prefix is less than 8, the decoded syntax is input immediately after decoding and less than 3, the suffix length is not 0, and the prefix is larger than 3, and
   a value of the suffix length is maintained and output as an updated suffix length, if the decoded suffix length is less than 6, the decoded prefix is less than 8, the decoded syntax is input immediately after decoding and less than 3, the suffix length is not 0, and the prefix is not more than 3.

* * * * *